United States Patent
Goekcen et al.

(10) Patent No.: US 9,812,523 B2
(45) Date of Patent: Nov. 7, 2017

(54) CAPACITANCE STRUCTURE

(71) Applicant: Infineon Technologies AG, Neubiberg (DE)

(72) Inventors: Mehmet Goekcen, Unterhaching (DE); Jacek Kruppa, Unterhaching (DE); Thomas Steinecke, Hofsingelding (DE)

(73) Assignee: Infineon Technologies AG, Neubiberg (DE)

( * ) Notice: Subject to any disclaimer, the term of this patent is extended or adjusted under 35 U.S.C. 154(b) by 304 days.

(21) Appl. No.: 13/902,760

(22) Filed: May 24, 2013

(65) Prior Publication Data

US 2013/0313681 A1 Nov. 28, 2013

(30) Foreign Application Priority Data

May 24, 2012 (DE) .................. 10 2012 010 305

(51) Int. Cl.
*H01L 49/02* (2006.01)
*H01L 29/94* (2006.01)
*H01L 23/495* (2006.01)
*H01L 23/522* (2006.01)
(Continued)

(52) U.S. Cl.
CPC ........ *H01L 28/60* (2013.01); *H01L 23/49589* (2013.01); *H01L 23/5223* (2013.01); *H01L 23/642* (2013.01); *H01L 29/945* (2013.01); *H01L 24/16* (2013.01); *H01L 24/49* (2013.01); *H01L 24/73* (2013.01); *H01L 2224/16145* (2013.01); *H01L 2224/16225* (2013.01); *H01L 2224/16265* (2013.01); *H01L 2224/32145* (2013.01); *H01L 2224/32225* (2013.01); *H01L 2224/32245* (2013.01); *H01L 2224/48091* (2013.01); *H01L 2224/48145* (2013.01); *H01L 2224/48227* (2013.01); *H01L 2224/48247* (2013.01); *H01L 2224/48265* (2013.01); *H01L 2224/73207* (2013.01); *H01L 2224/73265* (2013.01); *H01L 2924/00014* (2013.01);
(Continued)

(58) Field of Classification Search
None
See application file for complete search history.

(56) References Cited

U.S. PATENT DOCUMENTS 7,382,216 B2  6/2008  Saito et al.
7,548,407 B2  6/2009  Peluso
7,700,986 B2  4/2010  Huang
(Continued)

*Primary Examiner* — Whitney T Moore
(74) *Attorney, Agent, or Firm* — Eschweiler & Potashnik, LLC

(57) ABSTRACT

A capacitance structure includes a first input terminal configured to input a first input signal, a first output terminal configured to output the first output signal, a second input terminal configured to input a second input signal, a second output terminal configured to output a second output signal, and a plurality of trench cells. Each of the plurality of trench cells includes a first electrode and a second electrode. The first electrodes of the plurality of trenches are interconnected to form a first electrode of the capacitor structure, the second electrodes of the plurality of trench cells are interconnected to form a second electrode of the capacitor structure, the first electrode of the capacitor structure is connected to the first input signal, and the second electrode of the capacitor structure is connected to the input second signal.

15 Claims, 5 Drawing Sheets

(51) Int. Cl.
*H01L 23/64* (2006.01)
*H01L 23/00* (2006.01)

(52) U.S. Cl.
CPC ............... *H01L 2924/19104* (2013.01); *H01L 2924/19105* (2013.01); *H01L 2924/3011* (2013.01)

(56) References Cited

U.S. PATENT DOCUMENTS

| | | |
|---|---|---|
| 2009/0161298 A1 | 6/2009 | Lee |
| 2009/0318096 A1 | 12/2009 | Deguchi et al. |
| 2012/0211865 A1* | 8/2012 | Tian .................... H01L 27/0805 257/532 |

* cited by examiner

CAPACITANCE STRUCTURE

RELATED APPLICATION

This Application claims priority benefit of German Patent Application No. 102012010305.0, which was filed on May 24, 2012. The entire contents of the German Patent Application are incorporated herein by reference.

BACKGROUND

The present invention relates to a capacitor structure having a first input terminal, a first output terminal, a second input terminal and a second output terminal.

Blocking capacitors are often used to filter out high frequency noise from a signal. Blocking capacitors are also known as block capacitors or decoupling capacitors. As a blocking capacitor, a SMD capacitor may be switched externally to the integrated circuit (IC). Here, the SMD capacitor has a connection impedance, which creates a resistance at high frequencies. This impedance negatively affects the efficiency of the SMD capacitor, and may cause the SMD capacitor to operate in "bypass" mode.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Figure 1:
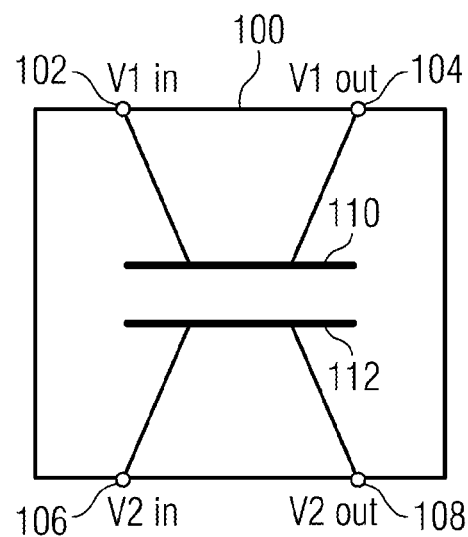
FIG. 1 illustrates a schematic representation of a capacitance structure according to one implementation.

One implementation provides a capacitance structure capable of filtering signals. Such signals may include high-frequency interference.

A capacitance structure includes a first input terminal which is configured such that via the first input terminal a first signal is input. The capacitor structure further comprises a first output terminal which is configured such that via the first output terminal the first signal is output. The capacitor structure further comprises a second input terminal which is configured such that via the second input terminal a second signal is input. The capacitor structure further comprises a second output terminal which is configured such that via the second output terminal the second signal is output. The capacitor structure further comprises a plurality of trench cells. Each cell of the plurality of trench cells includes a first electrode and a second electrode. The first electrodes of the plurality of cells are connected to form a first electrode of the capacitor structure. The second electrodes of the plurality of cells are connected to form a second electrode of the capacitor structure. The first electrode of the capacitor structure is connected to the first signal and the second electrode of the capacitor structure is connected to the second signal.

The capacitor structure comprises four terminals and is therefore designed as a multi-pole device. The capacitor structure further comprises a plurality of trench cells which together form a capacitor and to provide a capacitance value of the capacitance structure. The four input terminals are connected to the plurality of trench cells, such that a voltage or a current that is input from the input terminals of the capacitor structure is filtered by the plurality of cells, and the trench filtered voltage or filtered current is output from the output terminals of the capacitance structure. For example, the plurality of trench cells efficiently filters out high frequency interference.

In one implementation of the capacitor structure, the first signal includes a first power supply voltage and the second signal comprises a second power supply voltage. The first supply voltage is for example a positive supply voltage and the second supply voltage, for example, is a negative supply voltage or ground potential. The capacitance structure has the effect that a first supply voltage and a second supply voltage can be provided which is free from high-frequency interference. The first supply voltage and the second supply voltage, for example, are free of voltage dips and/or free from voltage overshoots.

In an implementation of the capacitance structure, the first input terminal is arranged spatially separated from the first output terminal and the second input terminal is arranged spatially separated from the second output terminal.

In one implementation of the capacitor structure, the first input terminal, the first output terminal, the second input terminal and the second output terminal are arranged such that a current flowing from one of the input terminals to any of the output terminals is fed through the plurality of trench cells.

In one implementation of the trench capacitor structure, the plurality of cells is arranged in an array. The dense arrangement of a plurality of trench cells in an array makes it possible to provide a capacitor structure with a high available capacity value.

In one implementation of the trench capacitor structure, the plurality of trench cells is formed in a substrate. The substrate comprises, for example, a semiconductor substrate.

In one implementation of the capacitor structure, the first electrodes of the plurality of trench cells are connected to one another in a first plane extending parallel to a first main surface of the substrate.

In one implementation of the capacitor structure, the second electrodes of the plurality of trench cells are connected to one another in a second plane extending parallel to a first main surface of the substrate.

In one implementation, the second electrodes of the plurality of trench cells are connected in the first plane.

In one implementation of the capacitor structure, the first electrodes of the plurality of trench cells are coupled together in a third plane, which extends parallel to the second main surface of the substrate.

In one implementation of the capacitor structure, the second electrodes of the plurality of trench cells are coupled together in a forth plane, which extends parallel to the second main surface of the substrate.

In one implementation of the capacitor structure, the first plane includes a metallization layer, which extends in parallel with the first main surface of the substrate.

In one implementation of the capacitor structure, the second plane includes a metallization layer, which extends in parallel with the first main surface of the substrate.

In one implementation of the capacitor structure, the third plane includes a metallization layer, which extends in parallel with the second main surface of the substrate.

In one implementation of the capacitor structure, the forth plane includes a metallization layer, which extends in parallel with the second main surface of the substrate.

In one implementation, the capacitor structure comprises the plurality of trench cell are provided by vias. The formation of the trenches by way of vias makes it becomes possible to couple the first electrodes of the plurality of trench cells, even when the electrodes are associated with a first main surface of the substrate and those associated with second main surface of the substrate. Moreover, the second electrodes of the plurality of trench cells may be connected to both trench cells of the first main surface of the substrate and trench cells of the second main surface of the substrate. By connecting the electrodes on both the first and the second main surfaces, the current flow is enhanced by the plurality of trench cells. The improved current flow results in improved filtering effect of capacitance structure with respect to radio frequency interference.

FIG. 1 illustrates a schematic representation of a capacitance structure according to one implementation. The capacitance structure 100 includes a first input terminal 102, a first output terminal 104, a second input terminal 106 and second output terminal 108. Via the first input port 102, a first signal V1in is input to the capacitance structure 100 and via the first output terminal 104, the first signal V1out is outputted from the capacitance structure 100. Through the second input port 106, a second signal V2in is input to the capacitance structure 100 and via the second output terminal 108, the second signal V2out is outputted from the capacitance structure 100.

The capacitance structure 100 further includes a plurality of trench cells which forms a capacitor and which is shown symbolically in FIG. 1 by a capacitor label. The plurality of trench cells are connected to each other to form a first electrode 110 and second electrode 112 of the capacitor structure 100. The first electrode 110 is connected to the first signal V1in and V1out, and the second electrode 112 is connected to the second signal V2in and V2out.

The capacitance structure 100 is configured as a quadpole, i.e. the capacitance structure 100 has four ports 102, 104, 106 and 108. The configuration of the capacitor structure 100 as a quad-pole means that a current which is input via the first input terminal 102 and the second input terminal 106 is provided through the condenser, before it is output via the first output terminal 104 and second output terminal 108.

The capacitance structure 100 serves as a filter for signals, which are provided having high frequency interference. The high frequency disturbances may cause for example by switching operations. In the implementation illustrated in FIG. 1 a signal, which is affected by a frequency error, is prevented from flowing past the capacitance of the capacitor structure 100. That is, the signal is forced through the condenser and the high frequency noise can be effectively filtered out by being discharged across the capacitor. The capacitance structure 100 thus serves as an effective decoupling capacitor for high frequency interference signals.

In one implementation, the first signal V1in and V1out comprises a first supply voltage, and the second signal V2in and V2out comprises a second supply voltage. The first voltage supply comprises, for example a positive supply voltage and the second voltage supply comprises, for example, a negative supply voltage. In an alternative embodiment, the second voltage supply comprises, for example, a ground potential or a reference potential.

A supply current is forced through a plurality of the trench cells or through the capacitor of the capacitor structure 100, when the first supply voltage and the second supply voltage are applied to the capacitance structure 100. If the supply current features high frequency interference, the interference is filtered by the capacitor. For example, the high frequency noise on the capacitor will be discharged to ground.

Figure 2:
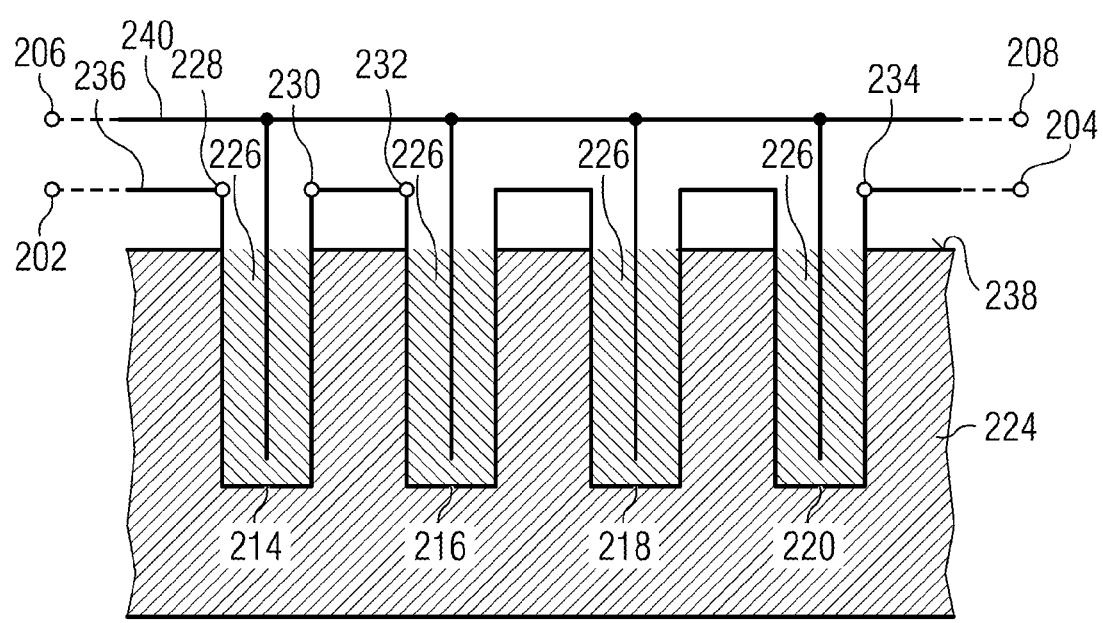
FIGS. 2-3 illustrate cross-sectional schematic representations of a capacitance structure according to one implementation.

FIG. 2 illustrates a cross-sectional schematic representation of a capacitance structure according to one implementation. The capacitance structure 200 includes a plurality of trench cells 214, 216, 218 and 220 formed in a substrate 224.

Each of the plurality of trench cells 214, 216, 218 and 220 comprises a cylindrical conductor, which is introduced into a respective trench and is formed at least partially in the substrate 224. For example, a cylindrical conductor is at least partially buried in a doped well of the substrate 224. Further, each of the plurality of trench cells 214, 216, 218 and 220 includes an inner conductor. Each of the inner conductors of the plurality of trench cells 214, 216, 218 and 220, respectively, is surrounded by a cylindrical conductor. Between the inner conductor and the respective cylindrical conductor, a dielectric material 226 introduced, as is shown by the shading in FIG. 2.

The inner conductor, the cylindrical conductor and the dielectric material 226 together form a capacitor, which is why the trench cells are 214, 216, 218 and 220 referred to as a capacitor cell or capacitor trench. In this case the cylindrical conductor forming the first trench electrode of the cell 214, 216, 218 and 220 and the inner conductor forms the second electrode of the trench cell 214, 216, 218 and 220. The first electrode is electrically isolated from the second electrode by the dielectric material 226. The trench capacitor formed by at least one of the cells 214, 216, 218 and 220 has a high capacity density, that is a high capacitance value per unit area with respect to a main surface of the substrate 224. The high capacity density results from the fact that at least one trench cell 214, 216, 218 and 220 protrudes in the substrate 224, that is at least one trench cell 214, 216, 218 and 220 is a vertical structure.

In FIG. 2 and in the following figures, the first electrodes of the plurality of trench cells 214, 216, 218 and 220 are shown as a cylindrical conductor. The cylindrical conductors are formed, for example, round or square. In another embodiment, the first electrodes of the plurality of trench cells 214, 216, 218 and 220 are generally formed as a protruding structure into a substrate, wherein the structure, for example, has a conical or oval in shape. The protruding into the substrate structure comprises, for example, a conductive semiconductor material, or a suitably prepared material.

As shown in FIG. 2, the first electrodes, that is, the cylindrical conductors, of the plurality of trench cells 214, 216, 218 and 220 are interconnected to form a first electrode of the capacitance structure 200. Further, the second electrode, that is, the inner conductor of the plurality of trench cells 214, 216, 218 and 220 are interconnected to form a second electrode of the capacitance structure 200.

The connection of the first electrode is formed such that a cylindrical conductor of a first trench cell 214 is connected at a first port 228 with a first input terminal 202 of the capacitor structure 200. At a second terminal 230 of the cylindrical conductor of the first trench cell 214 is connected to a first terminal 232 of a cylindrical conductor of a second trench cell 216. The first terminal 228 of the cylindrical conductor of the first trench cell 214 is spaced apart from the second terminal 230 of the cylindrical conductor of the first trench cell 214. The arrangement of the first port 228 and second port 230 is such that a current flowing from the first port 228 to second port 230, is urged by the cylindrical conductor of the cell 214 through the first trench of the cell 214.

The cylindrical conductor of the second trench 216, and the cylindrical conductors of the further trench cells 218, 220 are connected in the same manner as the conductors of the first cylindrical trench cell 214. A second terminal 234 of the cylindrical conductor of the trench cell 220 is connected to a first output terminal 204 of the capacitor structure 200. The first output terminal 204 of the capacitor structure 200 is spatially separated from the first input terminal 202 of the capacitor structure 200. As illustrated in FIG. 2, a current which flows from the first input terminal 202 of the capacitor structure 200 to the first output terminal 204 of the capacitor structure 200 flows through the coupled cylindrical conductors of the plurality of trench cells 214, 216, 218 and 220.

The coupled cylindrical conductor of the trench cells 214, 216, 218 and 220 and the connection of the cylindrical conductor of the first trench cell 214 to the first input terminal 202 of the capacitor structure 200 and the connection of the cylindrical conductor of the trench cell 220 with the first output terminal 204 of the capacitor structure 200 is, for example, as shown schematically in FIG. 2, formed in a first plane 236. The first plane 236 extends parallel to a first major surface 238 of the substrate 224.

The connection of the second electrode is formed such that the inner conductors of the plurality of trench cells 214, 216, 218 and 220 are connected in a second plane 240 with each other. Furthermore, the inner conductors of the plurality of trench cells 214, 216, 218 and 220 are coupled to a second input terminal 206 of the capacitor structure 200 and to a second output terminal 208 of the capacitor structure 200. The second input terminal 206 is arranged spatially separated from the second output port 208. As illustrated in FIG. 2 the inner conductors of the plurality of trench cells 214, 216, 218 and 220 cause a current flowing from the second input terminal 206 of the capacitor structure 200 to the second output terminal 208 of the capacitor structure 200 pass though all inner conductors of the trench cells 214, 216, 218 and 220.

As shown in FIG. 2, both the first plane 236 and second plane 240 extend parallel to the first major surface 238 of the substrate 224. The second plane 240 is arranged above the first plane 236.

Figure 3:
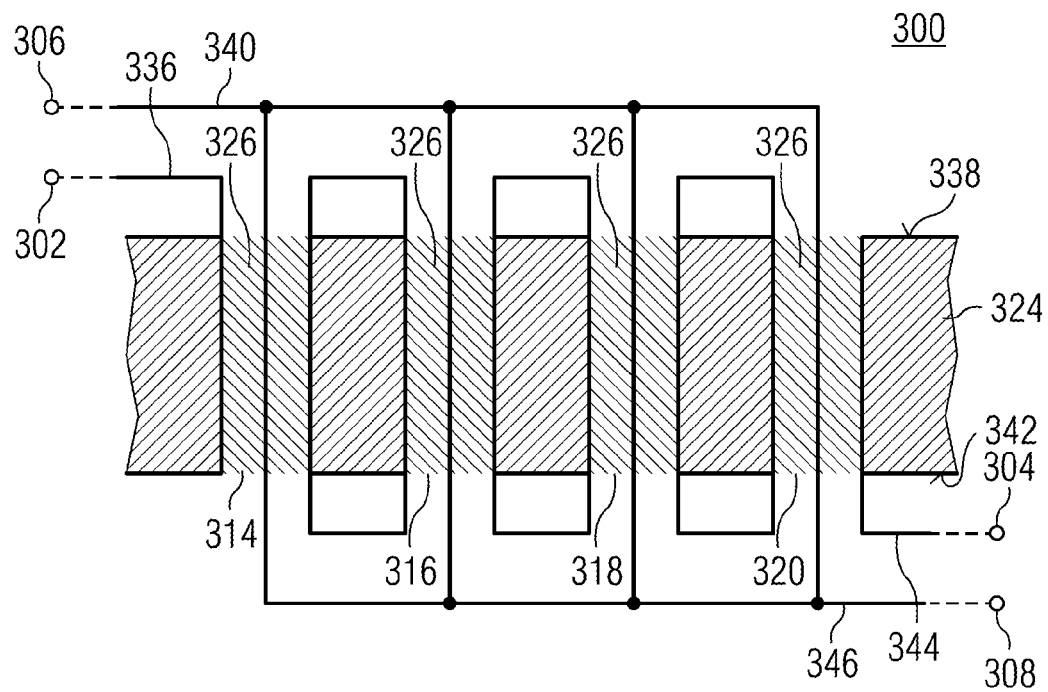

FIG. 3 illustrates cross-sectional schematic representations of a capacitance structure according to one implementation. Similar to the structure of FIG. 2, the capacitor structure 200 comprises a plurality of trench cells 314, 316, 318 and 320 formed in a substrate 324. Each of the plurality of trench cells 314, 316, 318 and 320 includes an inner conductor and a cylindrical conductor, and a dielectric material 326. The capacitance structure 300 further comprises a first input terminal 302, a first output terminal 304, a second input terminal 306 and second output terminal 308.

Similar to the implementation shown with reference to FIG. 2 and described, the cylindrical conductors of the plurality of trench cells 314, 316, 318 and 320 are formed in a first plane 336 and connected to each other to form a first electrode of the capacitor structure 300. The inner conductors of the plurality of trench cells 314, 316, 318 and 320 are connected to each other in a second plane 340 to form a second electrode of the capacitance structure 300. The first plane 336 and second plane 340 extend parallel to a first major surface 338 of the substrate 324. In the implementation shown with reference to FIG. 2 and described, the cylindrical conductors of the plurality of trench-cells 214, 216, 218 and 220 embedded in the substrate 224 and thus form blind holes or terminating holes. In contrast, the cylindrical conductors of the implementation shown in FIG. 3 are completely through the substrate 324, thus forming vias. The through cylindrical conductors, for example, may be prepared by dissolving the substrate 324 on a second main surface 342.

In the implementation shown in FIG. 3, the cylindrical conductors of the plurality of trench cells 314, 316, 318 and 320 pass through the substrate 324, and the cylindrical conductors extend interconnected in a third plane parallel to the second major surface 342 of the substrate 324. The inner conductors of the plurality of trench cells 314, 316, 318 and 320 pass through the through cylindrical conductors, and are coupled in fourth plane 346, which extends parallel to the second major surface 342 of the substrate 324. After the cylindrical conductors are connected together, both the first plane 336 over the first main surface 338 of the substrate 324 and the third plane 344 over the second major surface 342 of the substrate 324 are coupled, the current flow is improved by the cylindrical conductors. Accordingly, the current flow through the center conductors is improved, because a connection of the inner conductors is achieved both to the second layer 340 over the first main surface 338 of the substrate 324 and the fourth plane 346 of the second main surface 342 of the substrate 324. The enhanced current flow through the cylindrical conductors and the inner conductors of the plurality of trench cells 314, 316, 318 and 320 results in an improved filter effect of capacitor structure 300 with respect to high-frequency disturbances.

In one implementation, as illustrated in FIG. 3, the first input terminal 302 and the second input terminal 306 are located in a plane 336 and 340, respectively, parallel to the first main surface 338 of the substrate 324. The first output terminal 304 and second output terminal 308 are located in a plane 344 and 346, respectively, parallel to the second main surface 342 of the substrate 324.

The capacitance structure 200 illustrated with reference to FIGS. 2 and 3 show interconnected cylindrical conductors and the interconnected inner conductors on two levels. In the capacitor structure 300 shown with reference to FIG. 3 and described above includes interconnected cylindrical conductors and the inner conductors on four levels. In alternative implementations, the connection is realized in a single plane in three levels or more than four levels.

Figure 4:
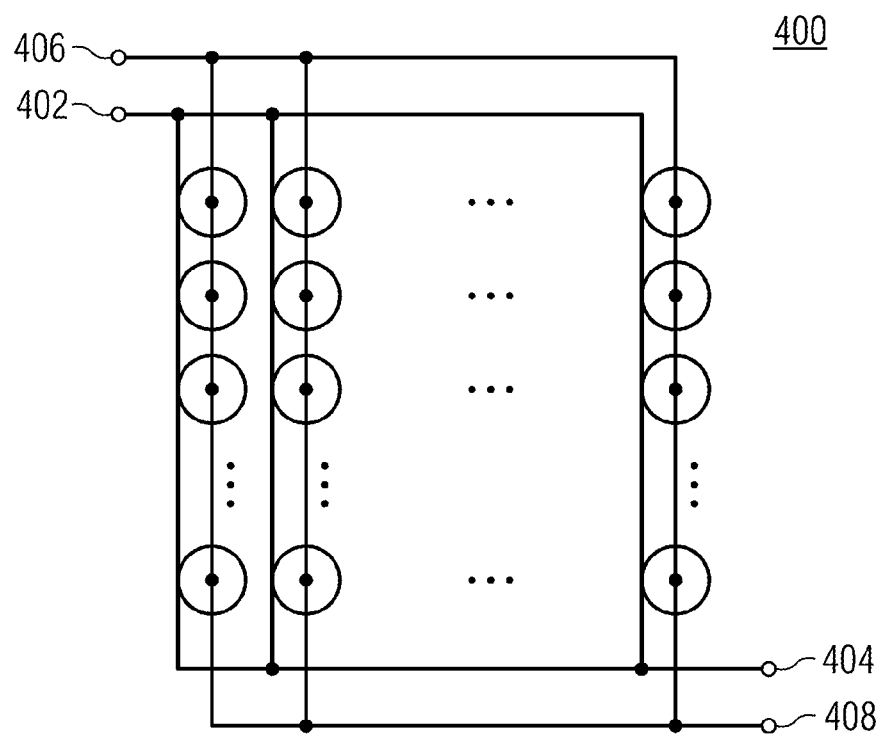
FIG. 4 illustrates a schematic representation of a capacitance structure according to another implementation.

FIG. 4 shows a schematic representation of a further implementation of the capacitor structure in a plan view. The capacitance structure 400 includes a plurality of trench cells. FIGS. 2 and 3 shows a part of a capacitor structure 200 and 300, each having four trench cells 214, 216, 218, 220, 314, 316, 318 and 320. The capacitor structure 400 includes a plurality of trench cells which are arranged in an array or in a field. Each of the plurality of trench cells comprises a cylindrical conductor and an inner conductor, as shown for example with reference to FIGS. 2 and 3 and described. The cylindrical conductors and the inner conductors, which is shown only schematically in FIG. 4 is, for example, configured as illustrated with reference to FIGS. 2 and 3 and described. The cylindrical conductors are connected and a first electrode of the capacitor structure 400 and the inner conductors are connected to one another to form a second electrode of the capacitor structure 400.

The capacitance structure 400 further comprises a first input terminal 402, a first output terminal 404, a second input terminal 406 and second output terminal 408. The first input port 402 is spaced apart in the capacitor structure 400 from the first output terminal 404, so that a current which is input via the first input port 402 in the capacitor structure 400 is guided by the plurality of cylindrical conductors of the array before the current is output via the first output terminal 404 back out of the capacitor structure 400. The second input port 406 is spaced apart from the second output terminal 408 within the capacitor structure 400, so that a current which is input via the second input terminal 406 in the capacitor structure 400 is guided by the plurality of inner conductor of the array before the current through the second output terminal 408 is output from the capacitance structure 400. The effect of the high capacitance density already described earlier is further enhanced in the capacitor structure 400, as the capacitor structure 400 has a plurality of trench cell is arranged closely adjacent to one another in an array.

Figure 10:
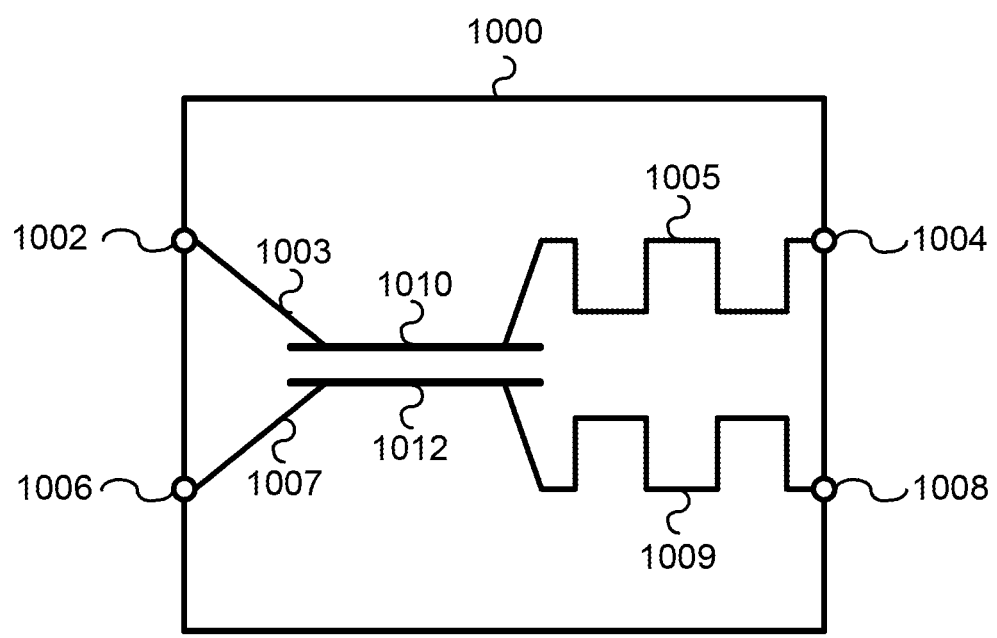
FIG. 10 illustrates a schematic representation of a capacitance structure according to an implementation.

FIG. 10 shows a schematic illustration of a further implementation of the capacitance structure. The capacitance structure 1000 comprises a first terminal 1002, a second terminal 1004, a third terminal 1006 and a fourth terminal 1008. The capacitance structure 1000 further comprises a plurality of trench cells. The plurality of trench cells forms a capacitor and the plurality of trench cells is illustrated symbolically in FIG. 10 by means of a capacitor symbol. The plurality of trench cells is coupled to each other in such a way that it forms a first electrode 1010 and a second electrode 1012 of the capacitance structure 1000 and the capacitor, respectively.

The first electrode 1010 of the capacitance structure 1000 is electrically coupled to the first terminal 1002 and to the second terminal 1004. The second electrode 1012 of the capacitance structure 1000 is electrically coupled to the third terminal 1006 and to the fourth terminal 1008. The electrically conducting connection 1003 between the first electrode 1010 of the capacitance structure 1000 and the first terminal 1002 and the electrically conducting connection 1007 between the second electrode 1012 of the capacitance structure 1000 and the third terminal 1006 each comprises a first impedance. The electrically conducting connection 1005 between the first electrode 1010 of the capacitance structure 1000 and the second terminal 1004 and the electrically conducting connection 1009 between the second electrode 1012 of the capacitance structure 1000 and the fourth terminal 1008 each comprises a second impedance. The first impedance is lower than the second impedance. Accordingly, the electrically conducting connections 1003, 1005, 1007, 1009 are designed asymmetrically.

In FIG. 10, a difference between the low-impedance electrical connection 1003 between the first electrode 1010 of the capacitance structure 1000 and the first terminal 1002, the low-impedance electrical connection 1007 between the second electrode 1012 of the capacitance structure 1000 and the third terminal 1006, the high-impedance electrical connection 1005 between the first electrode 1010 of the capacitance structure 1000 and the second terminal 1004 and the high-impedance electrical connection 1009 between the second electrode 1012 of the capacitance structure 1000 and the fourth terminal 1008 is illustrated schematically. The high-impedance electrical connections 1005, 1009 are illustrated meander-shaped. The impedance of a connection may be influenced in different ways. In one example, the impedance of a connection is determined by the selection of material or by adjusting a thickness or a length of a line. In one embodiment, the meander-shaped high-impedance electrical connections 1005, 1009 of FIG. 10 have a longer connection line than the low-impedance electrical connections 1003, 1007.

The capacitance structure 1000 is formed as a quad-pole, i.e., the capacitance structure 1000 comprises four terminals 1002, 1004, 1006 and 1008. The capacitance structure 1000 provides a filter for high frequency noise. In one example, a current is input in the capacitance structure 1000 via the first terminal 1002. The current is carrying a high frequency noise. The high frequency noise carrying current is conducted to the plurality of trench cells via the low-impedance electrical connection 1003. The high frequency noise is forced through the plurality of trench cells, is discharged via the plurality of trench cells and is output via the low-impedance electrical connection 1007 at the third terminal 1006. The current that has been filtered from the high frequency noise is passed by the plurality of trench cells and is output via the high-impedance electrical connection 1005 at the second terminal 1004. In one implementation, the filtered current is input again into the capacitance structure 1000 via the fourth terminal 1008 and is conducted to the plurality of trench cells via the high-impedance electrical connection 1009. The filtered current is then passed by the plurality of trench cells and is output at the third terminal 1006.

The capacitance structure 1000 provides a filter for high frequency noise. Within the capacitance structure 1000, high frequency noise is conducted in an efficient way via the low-impedance electrical connections 1003, 1007 to the plurality of trench cells and away from the plurality of trench cells, respectively. Because of the high impedance of the high-impedance electrical connections 1005, 1009 an additional attenuation of remaining high frequency noise in terms of a low pass filter is affected in the directions of the second terminal 1004 and the fourth terminal 1008. Therefore, an improved filter effect is produced. Accordingly, the capacitance structure 1000 provides an efficient blocking capacitor for high frequency noise. In one embodiment, the capacitance structure 1000 provides a filter for a high frequency noise carrying supply current. In a further embodiment, the capacitance structure 1000 provides a low pass filter or a high pass filter for a voltage signal.

The capacitance structure 1000 as illustrated and described in connection with FIG. 10 may be produced and formed in different ways as described exemplary in connection with FIG. 1-FIG. 4 above. Additionally, the capacitance structure 1000 as illustrated and described in connection with FIG. 10 may be may be implemented in a system similar to the system as described in connection with FIG. 5 above. Additionally, the capacitance structure 1000 as illustrated and described in connection with FIG. 10 may be implemented in a chip module similar to the chip module as illustrated and described in connection with FIG. 6-FIG. 9. The effect of the high-impedance electrical connection and the low-impedance electrical connection may be further increased by an appropriate selection of the bonding wires and the solder balls. For example, the impedance of a bonding wire may be determined by its geometry or by a selection of a certain material.

The described capacitance structures 100, 200, 300, 400 and 1000 can be manufactured in different ways and be designed in different ways, as will be explained below with reference to several examples.

For example, a same or similar process used for the production of the trench cell of the described implementations is also used for the production of a trench cell of a DRAM memory cell. The substrate 224 and 324 is for example a semiconductor substrate. In one embodiment, the semiconductor substrate is formed as a silicon substrate. In an alternative embodiment, the semiconductor substrate comprises a composite material, such as gallium arsenide (GaAs). The first level 236 and 336, the second level 240 and 340, the third layer 344 and fourth layer 346 includes for example a metallization. Compounds which are formed in the first, second, third and fourth metallization layers include, for example, aluminum or copper. The dielectric material 226 and 326 in one embodiment comprises silicon dioxide ($SiO2$). In another embodiment, the dielectric material 226 and 326 may have a high dielectric constant consistent with so-called "high-k dielectric".

A capacitance of the capacitor structure 100, 200, 300, 400 and 1000 is determined, for example, by the number, the geometry and/or by the design of cells used in the trench capacitor structure 100, 200, 300, 400 and 1000. The capacitance of the capacitor structure 100, 200, 300, 400 and 1000, can dictate an efficiency and/or filtering action of the capacitor structure 100, 200, 300, 400 and 1000. For example, the capacitance of the capacitor structure 100, 200, 300, 400 and 1000 is influenced by the selection of the dielectric material 226 and 326. Another factor which influences the capacitance of the capacitor structure 100, 200, 300, 400 and 1000, for example, is the aspect ratio, i.e. the ratio of the trench to trench length diameter of the trench cell used.

AS described with reference to FIG. 1 and described also with reference to FIG. 2, FIG. 3, FIG. 4 and FIG. 10, capacitance structures 100, 200, 300, 400 and 1000 are configured as four-terminal network shown, wherein a first input terminal 202 302, 402, 1002 is spaced apart from a first output terminal 204, 304, 404, 1004 and a second input terminal 206, 306, 406, 1006 spaced from a second output terminal 208, 308, 408, 1008. A signal that is input via the first input port 202 302, 402, 1002 and the second input terminal 204, 304, 404, 1004 is flows along a plurality of closely juxtaposed trench cells 214, 216, 218, 220, 314, 316, 318 and 320 before being output via the first output terminal 204, 304, 404, 1004 and second output terminal 208, 308, 408, 1008. The plurality of closely adjacent trench cells 214, 216, 218, 220, 314, 316, 318 and 320 form a capacitor of the capacitor structure 100, 200, 300, 400 and 1000. High-frequency disturbances that are input via the signal at the first input port 202 302, 402, 1002 and the second input terminal 204, 304, 404, 1004 in the capacitor structure 200, 300 400, and 1000 are filtered by the capacitor. The high-frequency interference, pass around the capacitor and the capacitor thus is not in the "bypass".

In one implementation, the capacitor structure 100, 200, 300, 400, 1000 results in an efficient filtering of high-frequency interference signals with a frequency of several 100 MHz. In one implementation, the capacitance of the capacitor structure 100, 200, 300 and 400 is more than 100 $nF/mm^2$.

With reference to FIGS. 1-4 and 10, the illustrated and described capacitance structures 100, 200, 300 400, and 1000 are configured as four-terminal network, ie, they each include four ports. In an alternative embodiment, a capacitor structure comprises more than four ports, that is, the capacitor structure is formed as a multi-pole structure. In this alternative embodiment the ports are arranged such that a current which is input via an input port is constrained by a capacitor of the capacitance structure before it is output through an output terminal.

Figure 5:
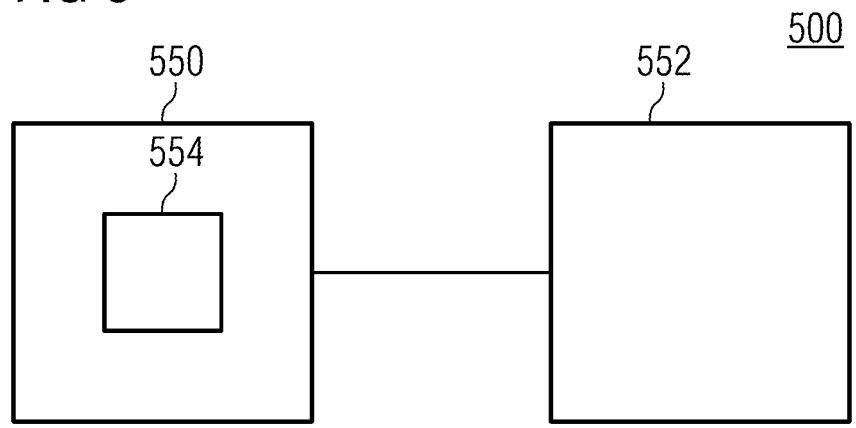
FIG. 5 illustrates the general diagram of a system according to an implementation.

FIG. 5 shows a schematic representation of an implementation of a system. The system 500 includes a chip capacitation 550 and a semiconductor chip 552 that is coupled to the capacitor chip 500. The capacitor chip 550 comprises a capacitance structure 554, as exemplified with reference to FIGS. 1-4 and 10 as shown and described. The semiconductor chip 552 includes, for example, an application specific integrated circuit (ASIC), a microcontroller (uC) or any other integrated circuit (IC). In one embodiment, the chip capacitor 550 is coupled to the semiconductor die 552, 552 to provide a signal to the semiconductor chip, wherein the chip capacitor 550 has filtered out high-frequency interference associated with the signal. In one implementation, the signal is a supply voltage. In this implementation, the chip capacitor 550, for example, receives a supply voltage from a voltage regulator (not shown in FIG. 5), and the supply voltage is subject to high-frequency disturbances. The chip capacitor 550 filters out high-frequency noise from the supply voltage, already with reference to FIGS. 1-4 and 10 as is shown and described, and returns the filtered supply voltage of the semiconductor chip 552.

In one implementation, the capacitor chip 550 comprises only a single capacitor structure 554, as exemplified with reference to FIGS. 1-4 and 10 and shown and described. In an alternative implementation, the condenser chip 550 comprises a plurality of capacitance structures (not shown in FIG. 5), each of the plurality of capacitance structures filters a separate, electrically insulated supply voltage. In this alternative implementation the chip capacitor 550 is, for example, as shown in FIG. 5, coupled to a single semiconductor chip 552, the semiconductor chip 552 having a plurality of supply voltages, which are operated electrically insulated from each other. In another implementation of the chip capacitor 550 is coupled to a plurality of semiconductor chips and each of the plurality of semiconductor chips is operated with one or more, mutually electrically insulated supply voltages.

In one implementation, the chip capacitor 550 and the semiconductor chip 552 are integrated into a common housing. By arranging in the same housing, it is possible to arrange the chip capacitor 550 close to the semiconductor chip 522. Because of the low spatial distance of the chip capacitor 550 and the semiconductor chip 552 they be connected together by short lines. In other words, the semiconductor chip 552 can be low-impedance connected to the chip capacitor 550. By the low-impedance connection between the chip capacitor 550 and the semiconductor chip 552, the advantage of the effective filtering of high frequency noise as already been described above will be further enhanced.

An illustrated with reference to FIG. 5, the described system 500 is used in a variety of areas, such as the entertainment industry, computer industry, the automotive industry or in the fields of industry and telecommunications.

Figure 6:
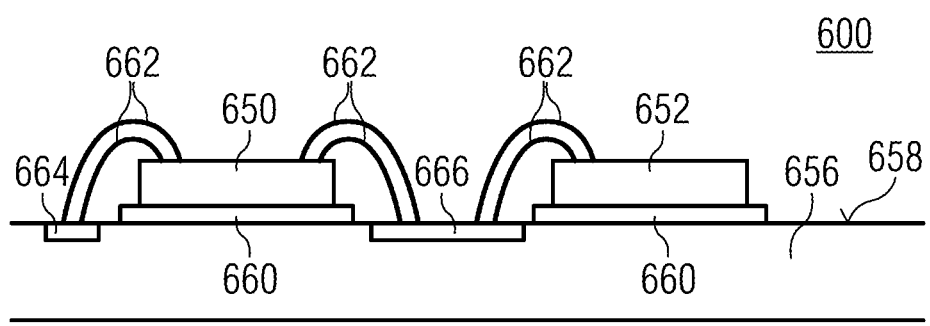
FIGS. 6-9 illustrate schematic cross-sectional representations of various implementations of the chip module.

FIG. 6 shows a schematic representation of a part of an implementation of a chip module in a cross section. The chip module 600 includes a lead frame 656, a chip capacitor 650 and a semiconductor chip 652. The chip capacitor 650 and the semiconductor chip 652 are disposed on a first major surface 658 of the chip carrier 656. The chip capacitor 650 is arranged on the chip carrier 656 in addition to the semiconductor chip 652 in a so-called chip-by-chip configuration. Both the chip capacitor 650 and the semiconductor chip 652 are mechanically connected via a layer 660 comprising, for example, adhesive material and insulation material to the chip carrier 656.

Further, both of the condenser chip 650 and the semiconductor chip 652, facing away from the chip carrier 656 major surface, are contacted with bond wires 662, which are connected to the first main surface 658 of the chip carrier 656 in the areas 664 and 666. Over the range 664, for example, an electric connection of the chip capacitor 650 to other elements (not shown in FIG. 6) is made possible. Over the range 666, an electric connection of the chip capacitor 650 and the semiconductor chip 652 is made possible.

Figure 7:
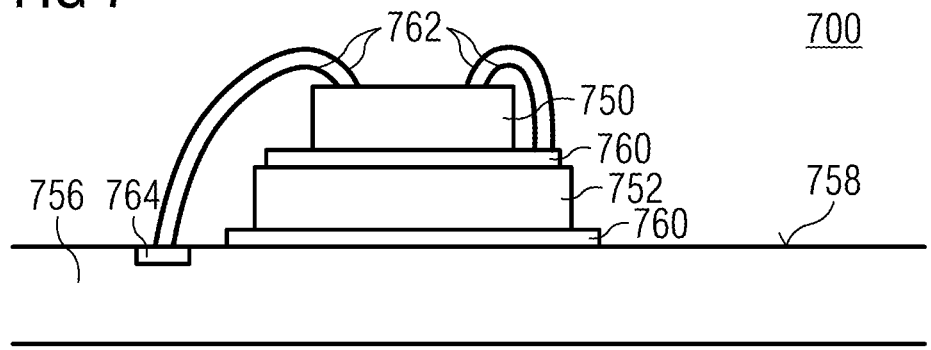

FIG. 7 shows a schematic representation of part of another embodiment of a chip module in a cross section. The chip module 700 includes a lead frame 756, a chip capacitor 750, and a semiconductor chip 752, wherein the semiconductor chip 752 is disposed on a first major surface 758 of the chip carrier 756. In contrast to the embodiment shown with reference to FIG. 6 and described, the condenser chip 750 is located on a chip carrier 756 remote from the main surface of the semiconductor chip 752 in a so-called chip-on-chip assembly. The semiconductor chip 752 is mechanically connected via a layer 760 of the chip carrier 756 and the chip capacitor 750 is mechanically connected via a layer 760 of the semiconductor chip 752. The layers 760 include, for example adhesive material and insulation material, in one example.

The electrical connection of the chip capacitor 750 and the semiconductor chip 752 is made via bonding wires 762. The chip capacitor 750 is coupled to the semiconductor chip 752 with bond wires 762, and further coupled to the first main surface 758 of the chip carrier 756 in areas 764 using the bond wires 762. Over the range 764, for example, an electric connection of the chip capacitor 750 to other elements (not shown in FIG. 7) may be achieved. Further, the chip capacitor 750 may have contacts facing away from the semiconductor chip 752, thus the bonding wires 762 that are connected to the semiconductor chip 752 make electrical connection between the chip capacitor 750 and the semiconductor chip 752.

The chip capacitors 650 and 750 illustrated with reference to FIG. 6 and FIG. 7 includes a capacitance structure, as exemplified with reference to FIG. 1-4 as shown and described. A first input terminal of the capacitance structure is electrically connected via a first bonding wire 662 and 762 to the chip carrier 656 and 756. A second input terminal of the capacitance structure is electrically connected through a second bonding wire 662 and 762 to the chip carrier 656 and 756. A first output terminal of the capacitance structure is electrically either directly via a third bond wire 662 and 762 to the semiconductor chip 652 and 752, as shown and described with reference to FIG. 7, or the region 666, as shown with reference to FIG. 6 and is described respectively.

The chip capacitors 650 and 750 illustrated with reference to FIG. 6 and FIG. 7 each have four terminals, and each of the four terminals is contacted via a single bond wire. In an alternative implementation, each of four terminals is coupled to two or more bond wires. In a further implementation the chip capacitor 650 and 750 includes more than one capacitor structure. In this example, each capacitance structure comprises four terminals and each terminal is in contact via at least one bonding wire.

Figure 8:
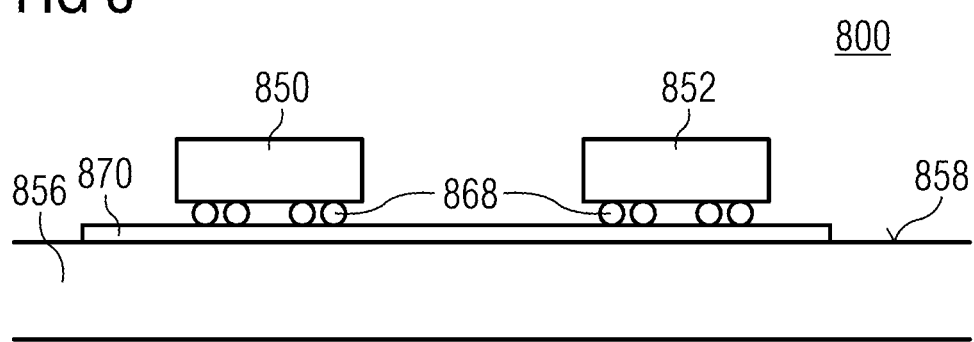

FIG. 8 shows a schematic representation of part of another implementation of a chip module in a cross section. The chip module 800 includes a chip carrier 856, a chip capacitor 850, and a semiconductor chip 852. Similar to the implementation shown with reference to FIG. 6 and as described, the condenser chip 850 is disposed adjacent to the semiconductor chip 852 on a first main surface 858 of the chip carrier 856 in a so-called chip-by-chip configuration. In contrast to the implantations of FIGS. 6 and 7, the electrical connection of the chip capacitor 850 and the semiconductor chip 852 via bonding wires are not used, rather solder balls are provided as so-called flip-chip contacts. Solder balls 868 are located on the first main surface 858 of the chip carrier 856 facing main surfaces of the chip capacitor 850 and the semiconductor chip 852. The solder balls 868 are electrically connected with each other or with other elements (not shown in FIG. 8), via a redistribution layer 870 disposed on the first main surface 858 of the chip carrier 856.

Figure 9:
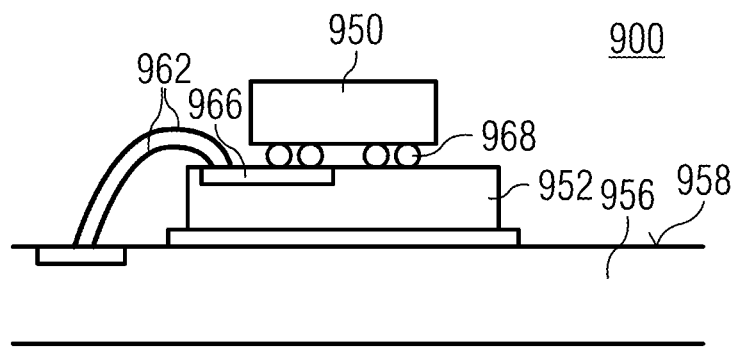

FIG. 9 shows a schematic representation of part of another implementation of a chip module in a cross section. The chip module 900 includes a chip carrier 956, a chip capacitor 950, and a semiconductor chip 952. Similar to with reference to FIG. 7 and as illustrated and described, the chip capacitor 950 is arranged on a chip carrier 956 remote from the main surface of the semiconductor chip 952 in a so-called chip-on-chip configuration. Similar to the illustrated with reference to FIG. 8, the electrical connection of the chip capacitor 950 is achieving using solder balls. Solder balls 968 are located on the first major surface 958 of the chip carrier 956 facing major surfaces of the capacitor chip 950. A portion of the solder balls 968 is connected to the semiconductor chip 952. The other part of the solder balls 968 in a region 966 is connected to the first main surface 958 of the chip carrier 956. Over the range 956, for example, takes place, an electrical connection with further elements (not shown in FIG. 9) via bonding wires 962.

The chip capacitors 850 and 950 illustrated with reference to FIG. 8 and FIG. 9 comprise a capacitance structure, as exemplified with reference to FIGS. 1-4 and 10 and as is shown and described. The chip capacitors 850 and 950 10 contain four ports and each of the four ports is contacted via a single solder ball. In an alternative implementation, similarly with reference to FIGS. 6 and 7, each of the four connections may be via two or more than two solder bumps. In an alternative implementation, the chip capacitors 850 and 950 include more than one capacitor structure. In this example, each capacitance structure comprises four terminals and each terminal is in contact via at least one solder ball.

With reference to FIGS. 6-9 the shown and described chip carriers 656, 756, 856 and 956 can be any type of support which is suitable for supporting a chip, consisting for example of metallic, ceramic or an organic material. The chip carriers 656, 756, 856 and 956 are formed as a lead frame, for example, interposer, or as printed circuit board.

In the with reference to FIG. 6-9 the shown and described chip modules 600, 700, 800 and 900, the electrical connection of the capacitor chips 650, 750, 850 and 950 and the semiconductor chips 652, 752, 852 and 952 is by bonding wires 662, 762 and 962 or 868 and 968 via solder balls. In an alternative implementation, the electrical connection takes place by other methods, such as through lamination or through direct copper.

The chip modules 600, 700, 800 and 900 are shown in FIGS. 6-9 are shown only schematically. For example, the housing surrounding the chip modules 600, 700, 800 and 900 is not shown. Furthermore, it was, for example, the appearance of plated-through holes in the chip carrier 656, 756, 856 and 956, on the regions on the first major surface 658, 758, 858 and 958 of the chip carrier 656, 756, 856 and 956, for example, solder bumps on a second main surface of the chip carrier 656, 756, 856 and 956 are electrically connected are omitted. A connection of the semiconductor chips 652, 752, 852 and 952 to other elements is also not shown.

Individual features and combinations of features, with respect to FIGS. 1-10, may be combined in order to obtain further embodiments. For example, with reference to FIGS. 6-9 illustrated and described embodiments provide a system, as shown and described with reference to FIG. 5. In such a system, a particularly effective filtering of high-frequency interference due to a low-impedance connection formed between a chip capacitor and a semiconductor chip on a common chip carrier is possible.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A capacitance structure comprising:
    a first input terminal configured to input a first input signal,
    a first output terminal configured to output the first output signal,
    a second input terminal configured to input a second input signal,
    a second output terminal configured to output a second output signal, and
    a plurality of trench cells,
    wherein each of the plurality of trench cells comprises a first electrode and a second electrode,
    wherein the first electrodes of the plurality of trenches are interconnected to form a first capacitance structure electrode,
    wherein the second electrodes of the plurality of trench cells are interconnected to form a second capacitance structure electrode,
    wherein the first capacitance structure electrode is connected to the first input terminal, and
    wherein the second capacitance structure electrode is connected to the second input terminal,
    wherein the plurality of trench cells is formed in a substrate,
    wherein the first electrodes of the plurality of trench cells are coupled to the first input terminal in a first plane extending parallel to a first main surface of the substrate, and
    wherein the first electrodes of the plurality of trench cells are coupled to the first output terminal in a third plane extending parallel to a second main surface of the substrate.

2. The capacitance structure according to claim 1, wherein the first input signal comprises a first supply voltage and said second input signal comprises a second supply voltage.

3. The capacitance structure according to claim 1, wherein the first input terminal is arranged spatially separated from the first output terminal and said second input terminal is arranged spatially separated from the second output terminal.

4. The capacitance structure according to claim 1, wherein the first input terminal, the first output terminal, the second input terminal and the second output terminal are arranged such that a current flowing from one of the input terminals to one of the output terminals flows through the plurality of trench cells.

5. The capacitance structure according to claim 1, wherein the plurality of trench cells is arranged in a cell array.

6. The capacitance structure according to claim 1, wherein the substrate comprises a semiconductor substrate.

7. The capacitance structure according to claim 1, wherein the second electrodes are each coupled to a common input.

8. The capacitance structure according to claim 1, wherein the first plane comprises a metallization plane.

9. The capacitance structure according to claim 1, wherein the third plane comprises a metallization plane.

10. The capacitance structure according to claim 1, wherein the plurality of trench cells are formed as vias.

11. The capacitance structure of claim 1,
    wherein the second electrodes of the plurality of trench cells are coupled to the second input terminal in a second plane extending parallel to the first main surface of the substrate, and
    wherein the second electrodes of the plurality of trench cells are coupled to the second output terminal in a forth plane extending parallel to the second main surface of the substrate.

12. A capacitance structure comprising:
    a first input terminal configured to input a first input signal,
    a first output terminal configured to output the first output signal,
    a second input terminal configured to input a second input signal,
    a second output terminal configured to output a second output signal, and
    a plurality of trench cells,
    wherein each of the plurality of trench cells comprises a first electrode and a second electrode,
    wherein the first electrodes of the plurality of trenches are interconnected to form a first capacitance structure electrode,
    wherein the second electrodes of the plurality of trench cells are interconnected to form a second capacitance structure electrode,
    wherein the first capacitance structure electrode is connected to the first input terminal,
    wherein the second capacitance structure electrode is connected to the second input terminal,
    wherein the plurality of trench cells is formed in a substrate,
    wherein the second electrodes of the plurality of trench cells are coupled to the second input terminal in a second plane extending parallel to a first main surface of the substrate, and
    wherein the second electrodes of the plurality of trench cells are coupled to the second output terminal in a forth plane extending parallel to a second main surface of the substrate.

13. The capacitance structure according to claim 12, wherein the second plane comprises a metallization plane.

14. The capacitance structure according to claim 12, wherein the forth plane comprises a metallization plane.

15. The capacitance structure of claim 12,
    wherein the first electrodes of the plurality of trench cells are coupled to the first input terminal in a first plane extending parallel to the first main surface of the substrate, and wherein the first electrodes of the plurality of trench cells are coupled to the first output terminal in a third plane extending parallel to the second main surface of the substrate.

* * * * *